United States Patent
Saha et al.

(12) 
(10) Patent No.: US 11,551,997 B2
(45) Date of Patent: Jan. 10, 2023

(54) THERMAL MANAGEMENT SOLUTIONS USING SELF-HEALING POLYMERIC THERMAL INTERFACE MATERIALS

(71) Applicant: Intel Corporation, Santa Clara, CA (US)

(72) Inventors: Amitesh Saha, Phoenix, AZ (US); Shushan Gong, Phoenix, AZ (US); Shrenik Kothari, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 786 days.

(21) Appl. No.: 16/355,468

(22) Filed: Mar. 15, 2019

(65) Prior Publication Data

US 2020/0294886 A1 Sep. 17, 2020

(51) Int. Cl.
*H01L 23/42* (2006.01)
*H01L 21/48* (2006.01)
*H01L 23/00* (2006.01)

(52) U.S. Cl.
CPC .......... *H01L 23/42* (2013.01); *H01L 21/4871* (2013.01); *H01L 24/09* (2013.01); *H01L 24/17* (2013.01); *H01L 2224/0401* (2013.01)

(58) Field of Classification Search
CPC combination set(s) only.
See application file for complete search history.

(56) References Cited

U.S. PATENT DOCUMENTS 9,725,577 B1 * 8/2017 Czaplewski ............. C09K 5/14
2014/0262192 A1 * 9/2014 Boday ....................... C09J 5/06
252/78.3

OTHER PUBLICATIONS

Blaiszik, B.J. et al., "Self-Healing Polymers and Composites", The Annual Review of Materials Research; vol. 40; pp. 33; 2010.
Canadell, J. et al., "Self-Healing Materials Based on Disulfide Links", Macromolecules; vol. 44, No. 8; pp. 2536-2541; 2011.
Cho, S.H. et al., "Self-Healing Polymer Coatings", Adv. Materials; vol. 21; pp. 645-649; 2009.

* cited by examiner

*Primary Examiner* — Dale E Page
*Assistant Examiner* — Wilner Jean Baptiste
(74) *Attorney, Agent, or Firm* — Essential Patents Group, LLP.

(57) ABSTRACT

A thermal interface material may be formed comprising a polymer material and a self-healing constituent. The thermal interface material may be used in an integrated circuit assembly between at least one integrated and a heat dissipation device, wherein the self-healing constituent changes the physical properties of the thermal interface material in response to thermo-mechanical stresses to prevent failure modes from occurring during the operation of the integrated circuit assembly.

25 Claims, 5 Drawing Sheets

THERMAL MANAGEMENT SOLUTIONS USING SELF-HEALING POLYMERIC THERMAL INTERFACE MATERIALS

TECHNICAL FIELD

Embodiments of the present description generally relate to the removal of heat from integrated circuit devices, and, more particularly, to thermal management solutions using self-healing polymeric thermal interface materials.

BACKGROUND

Higher performance, lower cost, increased miniaturization, and greater packaging density of integrated circuits within integrated circuit devices are ongoing goals of the electronics industry. As these goals are achieved, the density of power consumption of components within the integrated circuit devices has increased, which, in turn, increases the average junction temperature of the integrated circuit device. If the temperature of the integrated circuit device becomes too high, circuits within the integrated circuit device may be damaged or destroyed. Thus, heat dissipation devices are used to remove heat from the integrated circuit devices in an integrated circuit package. In one example, at least one integrated circuit device may be mounted to a substrate and the heat dissipation device may be attached to the substrate and extend over the integrated circuit device(s) to form the integrated circuit package. The distance between the integrated circuit device(s) and the heat dissipation device is known as the bondline thickness.

A thermal interface material is disposed between the integrated circuit device(s) and the heat dissipation device to form thermal contact therebetween. The thermal efficiency of the thermal interface material is critical to effectively remove heat from the integrated circuit device(s). Polymeric thermal interface materials are used extensively in integrated circuit packages. Although polymeric thermal interface materials have advantages, they also have intrinsic material properties on exposure to thermo-mechanical stresses which can result in "failure modes". These failure modes can include voiding, which can result in delamination from the heat dissipation device and/or the integrated circuit device(s); hardening, which can lead to loss of adhesion that can also result in delamination from the heat dissipation device and/or the integrated circuit devices; and pump-out, where the thermal interface material physically moves out from between the heat dissipation device and the integrated circuit device(s). The thermo-mechanical stresses that cause failure modes result from temperature cycles during the operation of the integrated circuit package. The temperature cycles cause warpage in integrated circuit device(s) within the integrated circuit package when it heats and cools during operation. For example, in a standard integrated circuit package with one integrated circuit, the heat dissipation device bottoms out at approximately the center of the integrated circuit device, due to the integrated circuit device's natural convex shape at room temperature. When the integrated circuit package is exposed to temperature gradients, the shape of the integrated circuit device changes from convex to flat or concave, which causes compression on the thermal interface material at edges or sidewalls of the integrated circuit device. When the integrated circuit package returns to room temperature, the integrated circuit device returns to a convex shape creating an elongation of the thermal interface material at the edge or sidewalls of the integrated circuit device. The mechanisms of compression and elongation may cause failure modes, which may result in the formation of an air-gap, also known as an air insulation layer, between the integrated circuit device and the heat dissipation device, which increases thermal resistance therebetween.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
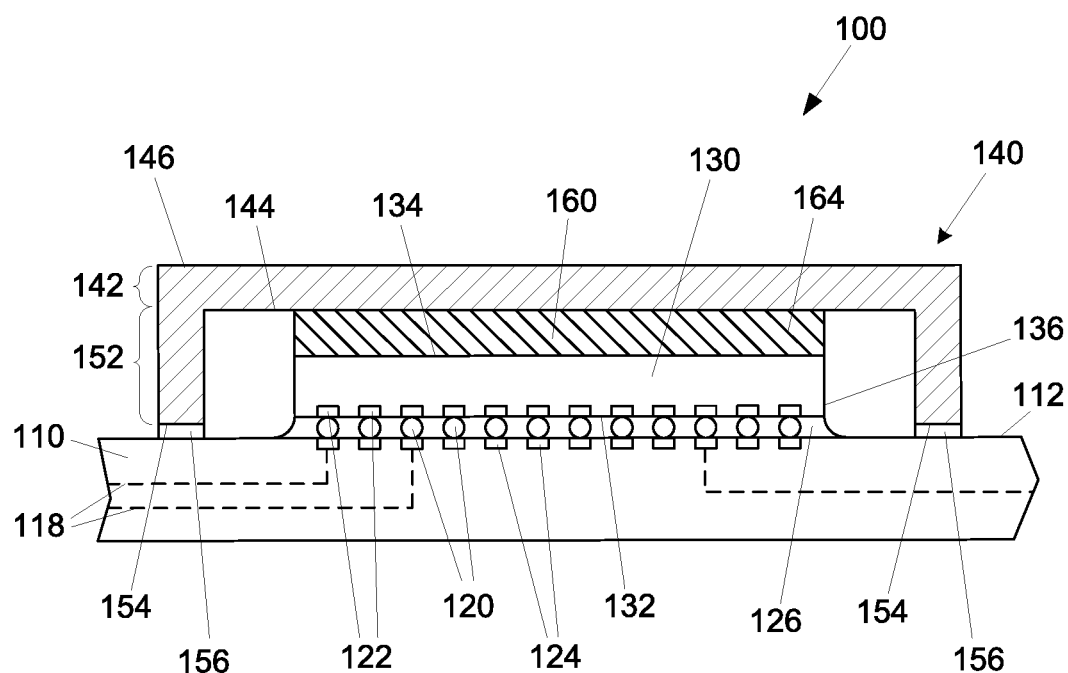
FIG. 1 is a side cross-sectional view of an integrated circuit assembly having a heat dissipation structure in thermal contact with an integrated circuit device, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures. as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad.

The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description include a thermal interface material that comprises a polymer material and a self-healing constituent. The thermal interface material may be used in an integrated circuit assembly between at least one integrated and a heat dissipation device, wherein the self-healing constituent changes the physical properties of the thermal interface material in response to thermo-mechanical stresses to prevent failure modes from occurring during the operation of the integrated circuit assembly.

As shown in FIG. 1, an integrated circuit assembly 100 may be formed by first providing or forming an electronic substrate 110, such as an interposer, a printed circuit board, a motherboard, or the like. At least one integrated circuit device 130 may be attached to a first surface 112 of the electronic substrate 110 with a plurality of interconnects 120. The plurality of interconnects 120 may extend between bond pads 122 formed in or on a first surface 132 (also known as the "active surface") of the integrated circuit device 130, and substantially mirror-image bond pads 124 in or on the first surface 112 of the electronic substrate 110. The at least one integrated circuit device 130 may further include a second surface 134 (also known as the "back surface") opposing the first surface 132 and at least one side 136 extending between the first surface 132 and the second surface 134 of the at least one integrated circuit device 130. The least one integrated circuit device 130 may be any appropriate device, including, but not limited to, a microprocessor, a multichip package, a chipset, a graphics device, a wireless device, a memory device, an application specific integrated circuit device, combinations thereof, stacks thereof, or the like. The interconnects 120 may be any appropriate electrically conductive material, including, but not limited to, metal filled epoxies and solders, such as tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys).

An underfill material 126, such as an epoxy material, may be disposed between the first surface 132 of the integrated circuit device 130 and the first surface 112 of the electronic substrate 110, and surrounding the plurality of interconnects 120. As will be understood to those skilled in the art, the underfill material 126 may be dispensed between the first surface 132 of the integrated circuit device 130 and the first surface 112 of the electronic substrate 110 as a viscous liquid and then hardened with a curing process. The underfill material 126 may also be a molded underfill material. The underfill material 126 may provide structural integrity and may prevent contamination, as will be understood to those skilled in the art.

As further shown in FIG. 1, the electronic substrate 110 may provide electrically conductive routes (illustrated as dashed lines 118) between the integrated circuit device 130 and external components (not shown). As will be understood to those skilled in the art, the bond pads 122 of the integrated circuit device 130 may be in electrical communication with integrated circuitry (not shown) within the integrated circuit device 130.

The electronic substrate 110 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like. The conductive routes 118 may be a combination of conductive traces (not shown) and conductive vias (not shown) extending through the plurality of dielectric material layers (not shown). These conductive traces and conductive vias are well known in the art and are not shown in FIG. 1 for purposes of clarity. The conductive traces and the conductive vias may be made of any appropriate conductive material, including but not limited to, metals, such as copper, silver, nickel, gold, and aluminum, alloys thereof, and the like. As will be understood to those skilled in the art, the electronic substrate 110 may be a cored substrate or a coreless substrate.

As further shown in FIG. 1, a heat dissipation device 140 may be attached to the electronic substrate 110. The heat dissipation device 140 may include a planar structure 142 having a first surface 144 and an opposing second surface 146, and may have at least one extension 152 projecting from the first surface 144 of the planar structure 142 of the heat dissipation device 140. The heat dissipation device extension(s) 152 may be attached to the first surface 112 of the electronic substrate 110 such that the first surface 144 of the planar structure 142 spans, but does not necessarily directly contact a second surface 134 (e.g. opposing the first surface 132) of the integrated circuit device 130, and a thermal interface material 160 may be disposed between the first surface 144 of the planar structure 142 of the heat dissipation device 140 and the second surface 134 of the integrated circuit device 130. The heat dissipation device extension(s) 152 may be attached to the electronic substrate 110 by any appropriate means, including but not limited to a sealant material 156, such as an epoxy, disposed between an attachment surface 154 of the heat dissipation device extension(s) 152 and the first surface 112 of the electronic substrate 110. In one embodiment, the heat dissipation device extension(s) 152 extend substantially perpendicular to the first surface 144 of the planar structure 142 of the heat dissipation device 140. It is understood that the term substantially perpendicular includes the heat dissipation device extension(s) 152 being plus or minus 5 degrees from 90 degrees.

The heat dissipation device 140 may be formed from any appropriate thermally conductive material, including, but not limited to copper, aluminum, and the like. In one embodiment, the heat dissipation device 140 may be formed from a molding or a stamping process, such that the heat dissipation device 140 is a single continuous material. In another embodiment, the planar structure 142 of the heat dissipation device 140 may be formed separately from the extension(s) 152 of heat dissipation device 140 and attached together.

Figure 2:
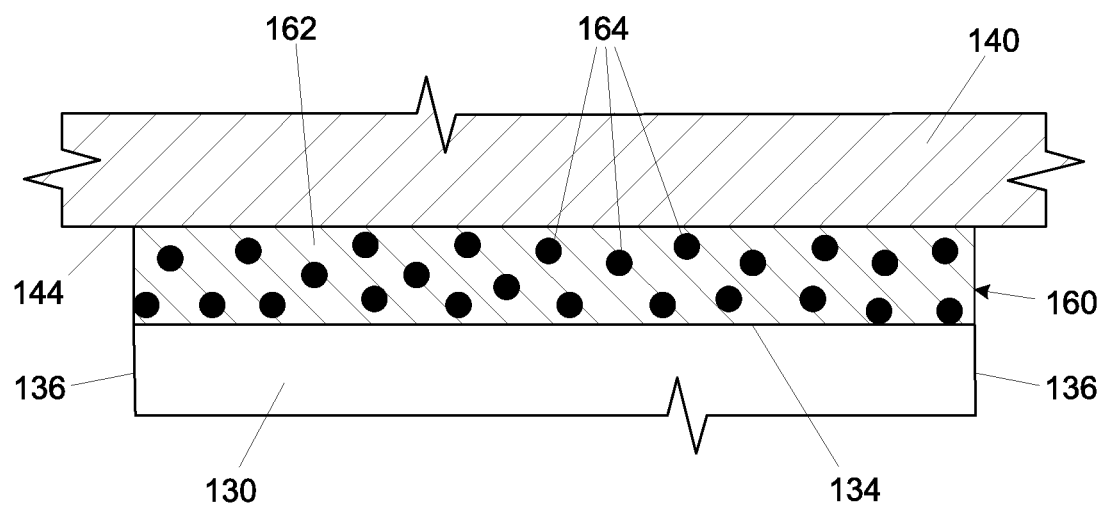
FIG. 2 are close-up side cross-sectional views of the integrated circuit assembly of FIG. 1 illustrating a thermal interface material between the heat dissipation structure and the integrated circuit device, according to an embodiment of the present description.

FIG. 2 illustrate the thermal interface material 160 between the first surface 144 of the planar structure 142 of the heat dissipation device 140 and the second surface 134 of the integrated circuit device 130. In one embodiment of the present description, the thermal interface material 160 may include a polymer material 162 and a self-healing constituent 164.

In one embodiment of the present description, the polymer material 162 may include a carrier material, such as, but not limited to, polydimethylsiloxane, polyurethane, poly (methy methacrylate), polyethylene of various molecular weights, and the like. In another embodiment of the present description, in addition to the carrier material, the polymer material 162 may include a filler material, such as, but not limited to, carbon-type fillers (such as graphite, graphene, carbon nanotubes, carbon black, and the like), metal materials (such as phase change metals (e.g. indium/bismuth/tin alloys and the like), liquid metal (e.g. liquid at room temperature), and traditional metals (e.g. copper, aluminum, silver, alloys thereof, and the like)), and ceramic materials (such as boron nitride (BN), aluminum oxide ($Al_2O_3$), and the like).

In an embodiment of the present description, the self-healing constituent 164 may be any material capable of forming chemical bonds to link materials within the thermal interface material 160, when the thermal interface material 160 is subjected to thermo-mechanical stresses. In one embodiment, the self-healing constituent 164 may be a sulfur-based constituent that can cleave and reattach during thermo-mechanical stress. In a specific embodiment, the self-healing constituent 164 may include, but is not limited to, disulfides and tetrasulfides.

In one embodiment of the present description, the self-healing constituent 164 may be chemically bound to the carrier material of the polymer material 162. In another embodiment of the present description, the self-healing constituent 164 may be chemically bound to the filler material of the polymer material 162. In another embodiment of the present description, the self-healing constituent 164 may be chemically bound to both the carrier material and the filler material of the polymer material 162.

Figure 3:
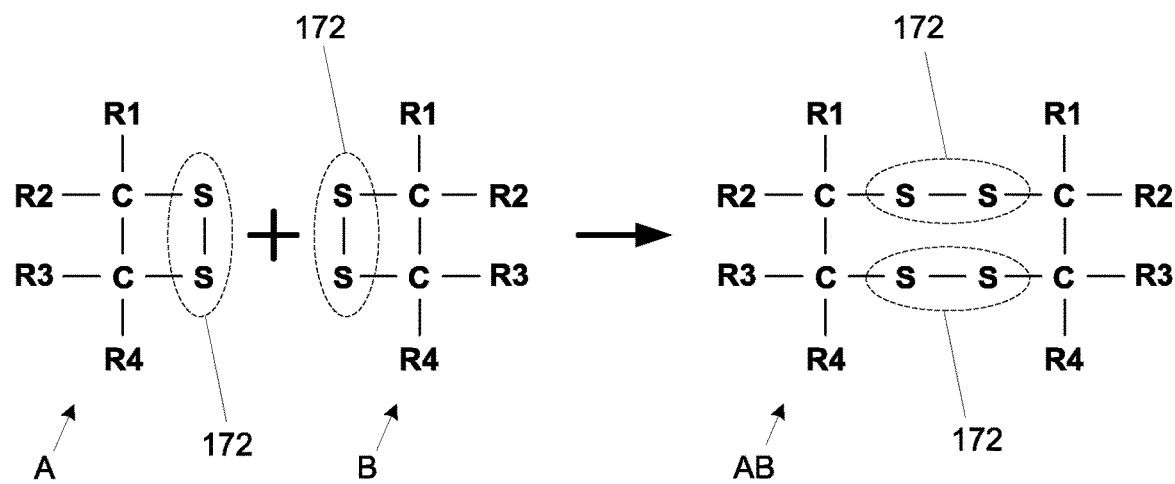
FIG. 3 is a schematic of a chemical cross-linking reaction, according to an embodiment of the present description.

But way of example, as shown in FIG. 3, a first molecular compound A and a second molecular compound B may each comprise a disulfide 172 attached to a carbon backbone —C—C—, wherein R1, R2, R3, and R4 may be carbon molecule chains. As shown, during thermo-mechanical stress the disulfides 172 on the first molecular compound A and the second molecular compound B may cleave and reattach to cross-link to form disulfides 172 therebetween and form a single molecular compound AB. This crosslinking may stiffen the thermal interface material 160 (see FIGS. 1 and 2) and prevent the failure modes, as previously discussed. It is understood that the first molecular compound A and second molecular compound B may be part of the filler material and/or the carrier material of the thermal interface material 160 (see FIGS. 1 and 2).

Figure 4:
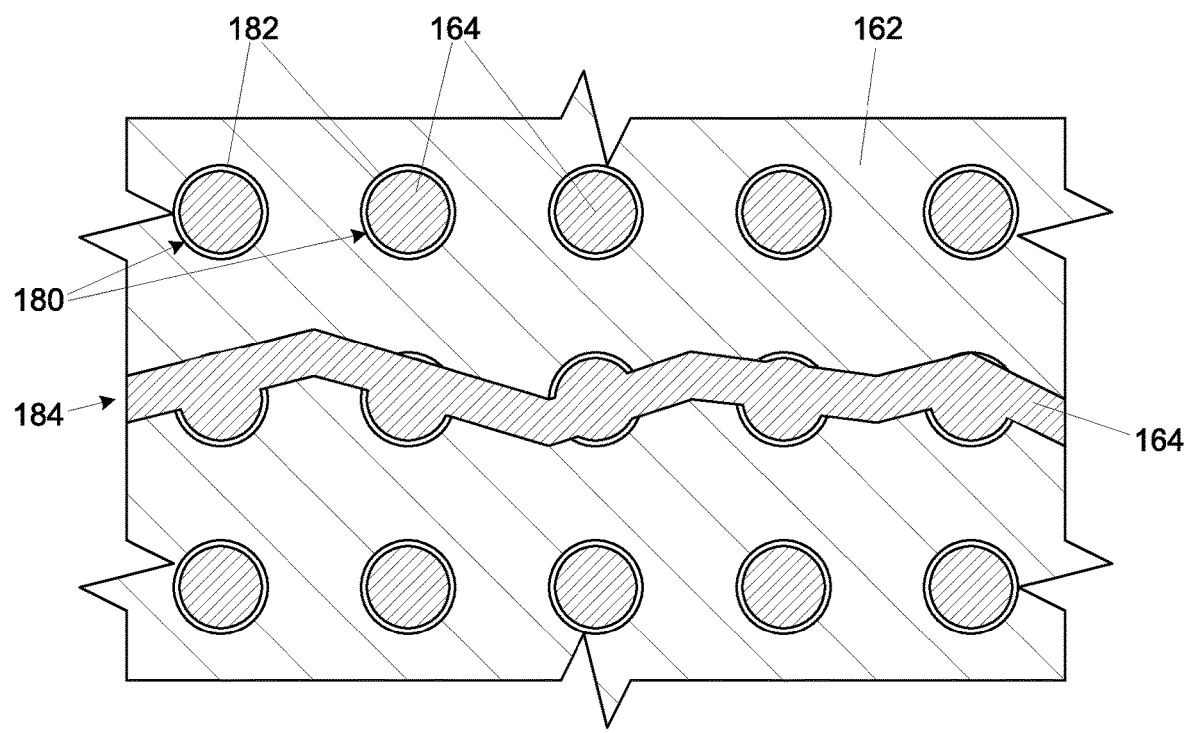
FIGS. 4-6 are side cross-sectional view of the thermal interface material, according to various embodiments of the present description.
Figure 5:
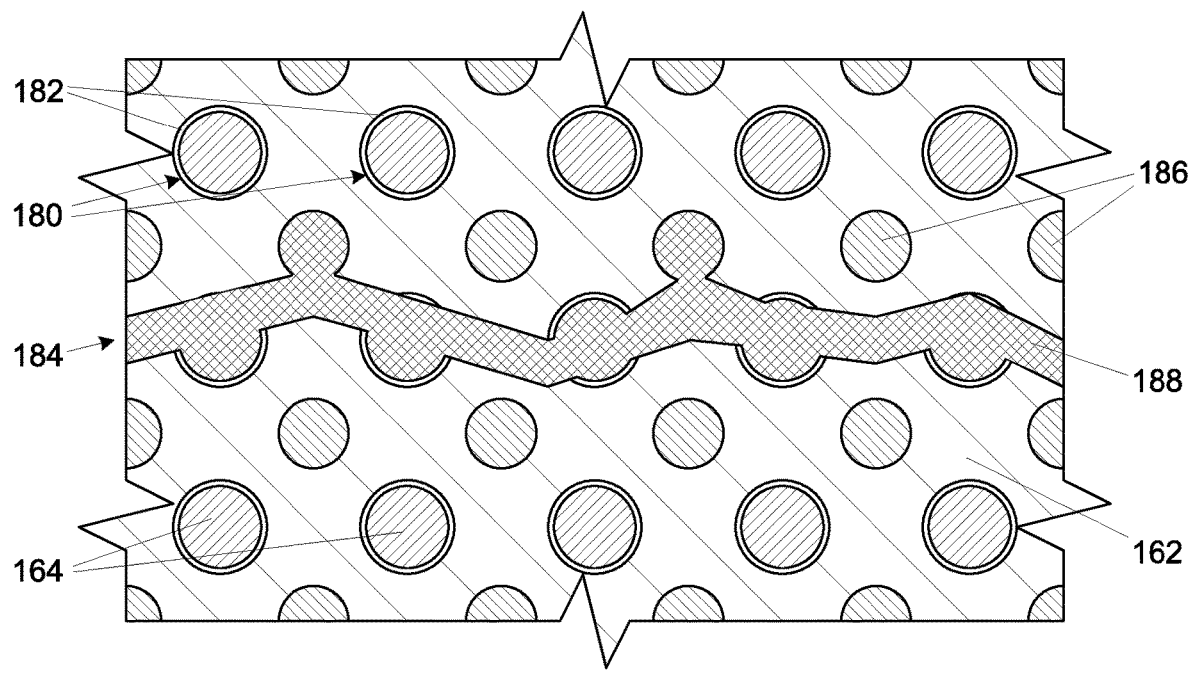
Figure 6:
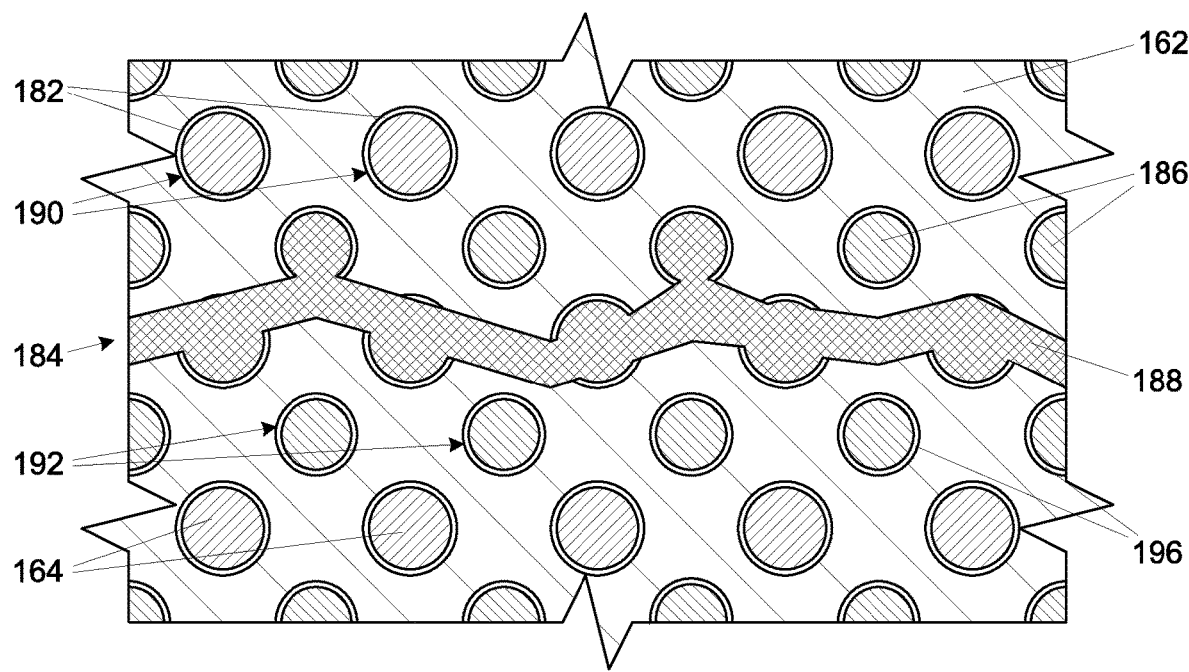

In a further embodiment of the present description, as shown in FIGS. 4-6, a microcapsule technique for self-healing may be utilized. As shown in FIG. 4, the thermal interface material 160 may include microcapsules 180 dispersed in the polymer material 162.

The microcapsules 180 may be comprised the self-healing constituent 164 encapsulated in a shell 182. The shell 182 may be formed of any appropriate material, including but not limited to, ethyl cellulose, polyvinyl alcohol, gelatin, sodium alginate, and the like. When a crack 184 occurs in the polymer material 162, the shell 182 may be broken and dispense the self-healing constituent 164 therein. The self-healing constituent 164 may at least partially fill and repair the crack 184, and, thus, prevent the failure modes previously discussed.

In one embodiment of the present description, as shown FIG. 5, the thermal interface material 160 may include microcapsules 180 and at least one catalytic agent 186 dispersed in the polymer material 162. As with the embodiment of FIG. 4, the microcapsules 180 may be comprised the self-healing constituent 164 encapsulated in the shell 182. When a crack 184 occurs in the polymer material 162, the shell 182 may be broken and dispense the self-healing constituent 164 therein. The self-healing constituent 164 may contact and react with the catalytic agents 186 to at least partially fill and repair the crack 184. In one embodiment, the self-healing constituent 164 may comprise an uncrosslinked polymer and the catalytic agent 186 may be a crosslinking agent, wherein the contact between the uncrosslinked polymer and the crosslinking agent crosslinks the self-healing constituent 164 for form the repair. In an embodiment of the present description, the uncrosslinked polymer may include, but is not limited to, polydimethylsiloxane, polyurethane, poly(methy methacrylate), polyethylene of various molecular weights, and the like, and the crosslinking agent would be complementary to the selected uncrosslinked polymer.

In another embodiment of the present description, as shown in FIG. 6, the thermal interface material 160 may include a plurality of first microcapsules 190 and a plurality of second microcapsules 192 dispersed in the polymer material 162. The first microcapsules 190 may be comprised the self-healing constituent 164 encapsulated in a first shell 194 and the second microcapsules 192 may be comprised the catalytic agent 186 encapsulated in a second shell 196. When a crack 184 occurs in the polymer material 162, the first shells 194 and the second shells 196 may be broken and dispense the self-healing constituent 164 and the catalytic agent 186 therein, respectively. The self-healing constituent 164 may contact and react with the catalytic agent 186 to at least partially fill and repair the crack 184.

Figure 7:
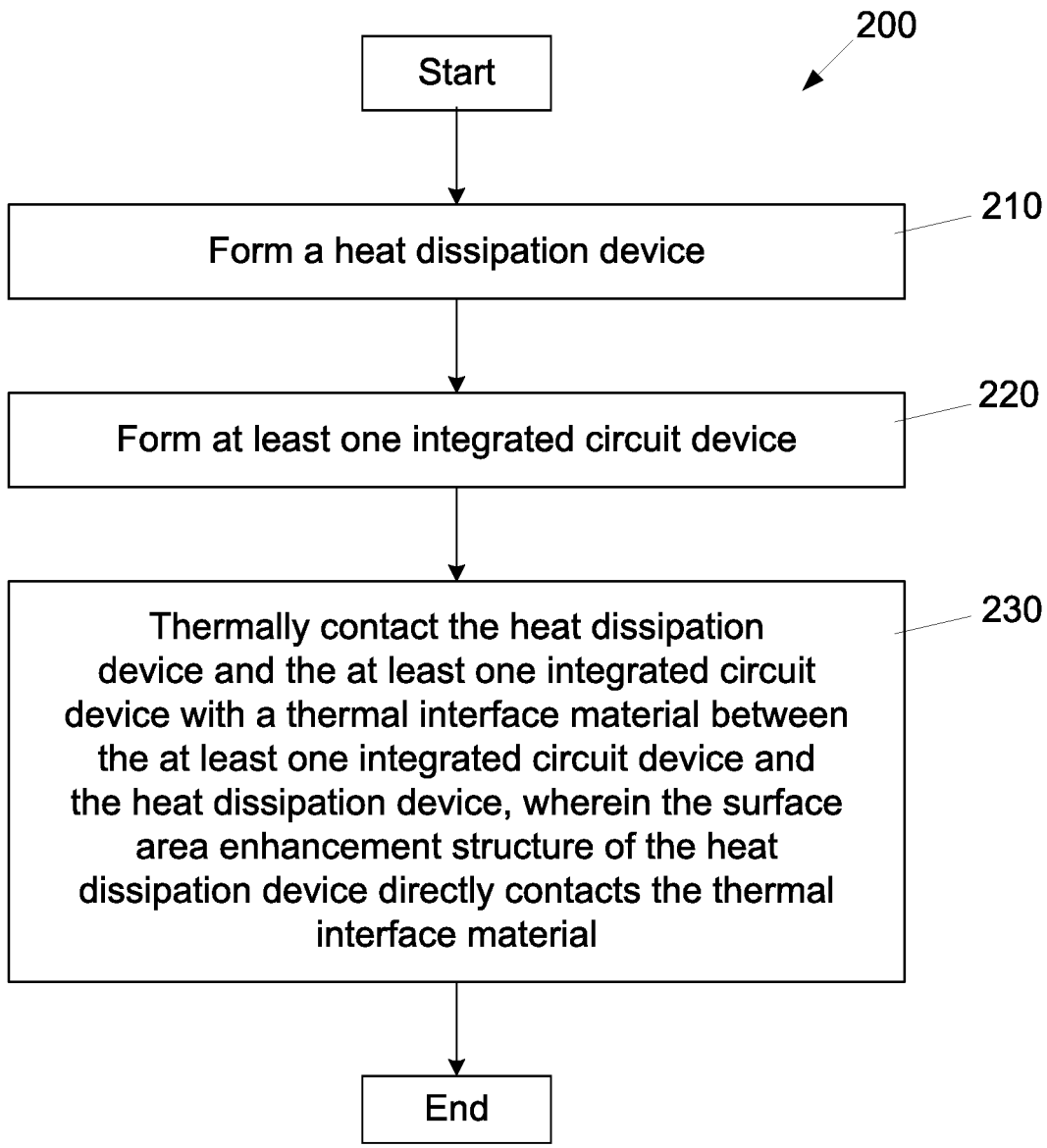
FIG. 7 is a flow diagram of a method for fabricating an integrated circuit assembly, according to various embodiments of the present description.

FIG. 7 is a flow chart of a process 200 of fabricating an integrated circuit assembly according to an embodiment of the present description. As set forth in block 210, at least one integrated circuit device may be formed. A heat dissipation device may be formed, as set forth in block 220. As set forth in block 230, the heat dissipation device and at least one integrated circuit device may be brought into thermal contact with a thermal interface material disposed between the heat dissipation device and the at least one integrated circuit device, wherein the thermal interface material comprises a polymer material and self-healing constituent.

Figure 8:
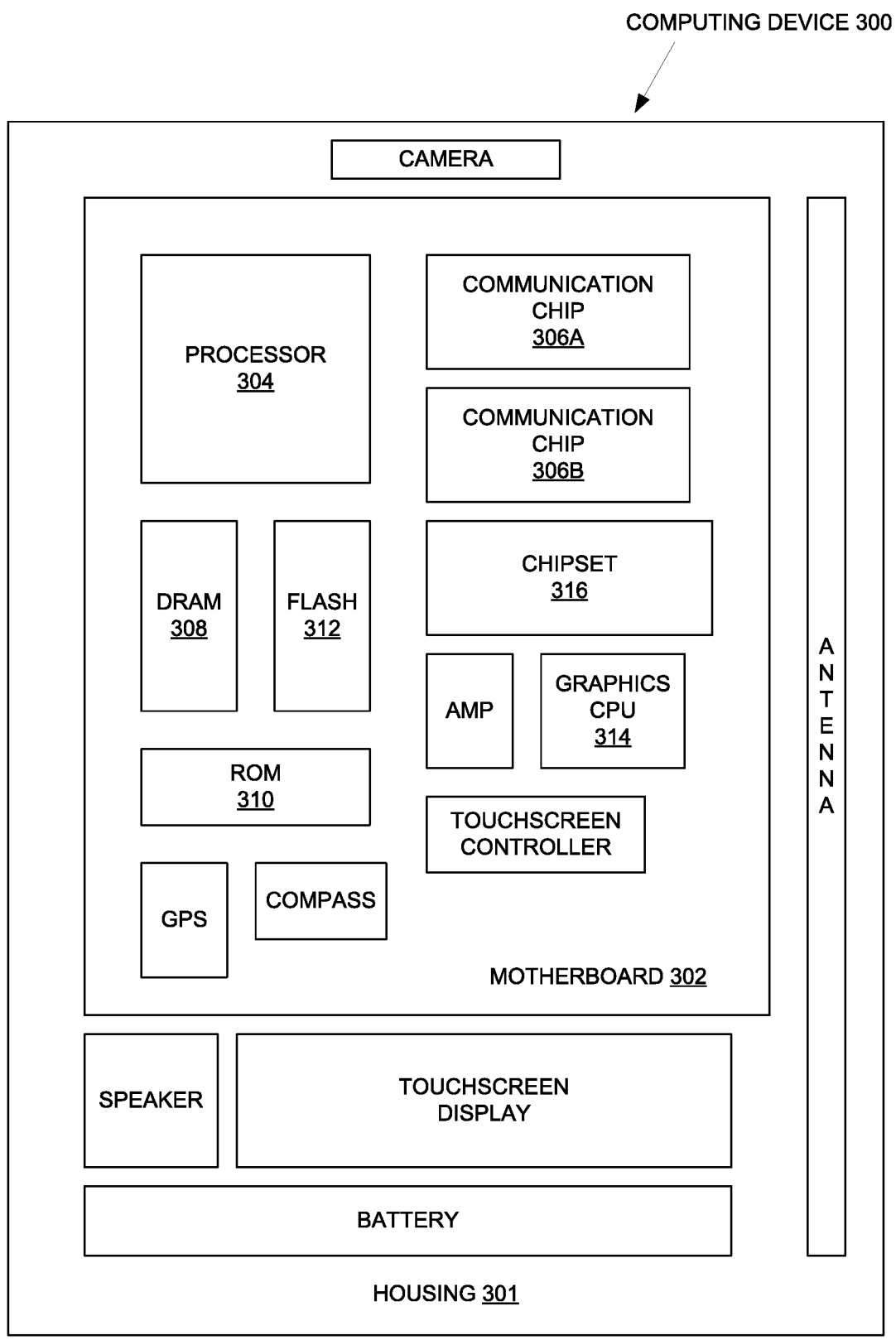
FIG. 8 is an electronic device/system, according to an embodiment of the present description.

FIG. 8 illustrates an electronic or computing device 300 in accordance with one implementation of the present description. The computing device 300 may include a housing 301 having a board 302 disposed therein. The computing device 300 may include a number of integrated circuit components, including but not limited to a processor 304, at least one communication chip 306A, 306B, volatile memory 308 (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 302. In some implementations, at least one of the integrated circuit components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include at least one integrated circuit device, a heat dissipation device thermally contacting the at least one integrated circuit device, and a thermal interface material between the at least one integrated circuit device and the heat dissipation device, wherein the thermal interface material comprises a polymer material and self-healing constituent.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-8. The subject matter may be applied to other integrated circuit devices and assembly applications, as well as any appropriate electronic application, as will be understood to those skilled in the art.

The follow examples pertain to further embodiments and specifics in the examples may be used anywhere in one or more embodiments, wherein Example 1 is an integrated circuit assembly may comprise at least one integrated circuit device, a heat dissipation device thermally contacting the at least one integrated circuit device, and a thermal interface material between the at least one integrated circuit device and the heat dissipation device, wherein the thermal interface material comprises a polymer material and a self-healing constituent.

In Example 2, the subject matter of Example 1 can optionally include the self-healing constituent comprising a sulfur-based constituent.

In Example 3, the subject matter of Example 2 can optionally include the sulfur-based constituent comprising a disulfide.

In Example 4, the subject matter of Example 2 can optionally include the sulfur-based constituent comprising a tetrasulfide.

In Example 5, the subject matter of any of Examples 1 to 4 can optionally include the polymer material including a carrier material and a filler material, wherein the self-healing constituent is attached to at least one of the carrier material and the filler material.

In Example 6, the subject matter of Example 5 can optionally include the filler material comprising at least one a carbon-type filler, a metal material, and a ceramic material.

In Example 7, the subject matter of Example 6 can optionally include the carbon-type filler comprising graphene.

In Example 8, the subject matter of Example 6 can optionally include the carbon-type filler comprising carbon black.

In Example 9, the subject matter of Example 1 can optionally include the self-healing constituent being encased in a shell and dispersed in the polymer material.

In Example 10, the subject matter of Example 9 can optionally include a catalytic agent dispersed in the polymer material.

In Example 11, the subject matter of Example 10 can optionally include the catalytic agent being encased in a shell.

In Example 12, the subject matter of Example 11 can optionally include a substrate, wherein the at least one integrated circuit device is electrically attached to the substrate.

In Example 13, the subject matter of Example 12 can optionally include the heat dissipation device being attached to the substrate.

Example 14 is an electronic system that may comprise a board and an integrated circuit assembly attached to the board, wherein the integrated circuit assembly may comprise at least one integrated circuit device, a heat dissipation device thermally contacting the at least one integrated circuit device, and a thermal interface material between the at least one integrated circuit device and the heat dissipation device, wherein the thermal interface material comprises a polymer material and a self-healing constituent.

In Example 15, the subject matter of Example 14 can optionally include the self-healing constituent comprising a sulfur-based constituent.

In Example 16, the subject matter of Example 15 can optionally include the sulfur-based constituent comprising a disulfide.

In Example 17, the subject matter of Example 15 can optionally include the sulfur-based constituent comprising a tetrasulfide.

In Example 18, the subject matter of any of Examples 14 to 17 can optionally include the polymer material including a carrier material and a filler material, wherein the self-healing constituent is attached to at least one of the carrier material and the filler material.

In Example 19, the subject matter of Example 18 can optionally include the filler material comprising at least one a carbon-type filler, a metal material, and a ceramic material.

In Example 20, the subject matter of Example 19 can optionally include the carbon-type filler comprising graphene.

In Example 21, the subject matter of Example 19 can optionally include the carbon-type filler comprising carbon black.

In Example 22, the subject matter of Example 14 can optionally include the self-healing constituent being encased in a shell and dispersed in the polymer material.

In Example 23, the subject matter of Example 22 can optionally include a catalytic agent dispersed in the polymer material.

In Example 24, the subject matter of Example 23 can optionally include the catalytic agent being encased in a shell.

In Example 25, the subject matter of Example 14 can optionally include the heat dissipation device being attached to the board.

Example 26 is a method of fabrication an integrated circuit assembly that may comprise forming a heat dissipation device, forming at least one integrated circuit device, and thermally contacting the heat dissipation device and the at least one integrated circuit device with a thermal interface material between the at least one integrated circuit device and the heat dissipation device, wherein the thermal interface material comprises a polymer material and a self-healing constituent.

In Example 27, the subject matter of Example 26 can optionally include the self-healing constituent comprising a sulfur-based constituent.

In Example 28, the subject matter of Example 27 can optionally include the sulfur-based constituent comprising a disulfide.

In Example 29, the subject matter of Example 27 can optionally include the sulfur-based constituent comprising a tetrasulfide.

In Example 30, the subject matter of any of Examples 26 to 29 can optionally include the polymer material including a carrier material and a filler material, wherein the self-healing constituent is attached to at least one of the carrier material and the filler material.

In Example 31, the subject matter of Example 30 can optionally include the filler material comprising at least one a carbon-type filler, a metal material, and a ceramic material.

In Example 32, the subject matter of Example 31 can optionally include the carbon-type filler comprising graphene.

In Example 33, the subject matter of Example 31 can optionally include the carbon-type filler comprising carbon black.

In Example 34, the subject matter of Example 26 can optionally include the self-healing constituent being encased in a shell and dispersed in the polymer material.

In Example 35, the subject matter of Example 34 can optionally include a catalytic agent dispersed in the polymer material.

In Example 36, the subject matter of Example 35 can optionally include the catalytic agent being encased in a shell.

In Example 37, the subject matter of Example 26 can optionally include forming a substrate and electrically attaching the at least one integrated circuit device to the substrate.

In Example 38, the subject matter of Example 37 can optionally include attaching the heat dissipation device to the substrate.

Having thus described in detail embodiments of the present invention, it is understood that the invention defined by the appended claims is not to be limited by particular details set forth in the above description, as many apparent variations thereof are possible without departing from the spirit or scope thereof

What is claimed is:

1. An integrated circuit assembly, comprising:
   at least one integrated circuit device;
   a heat dissipation device thermally contacting the at least one integrated circuit device; and
   a thermal interface material between the at least one integrated circuit device and the heat dissipation device, wherein the thermal interface material comprises a polymer material and a self-healing constituent, and wherein the self-healing constituent comprises a sulfur-based constituent.

2. The integrated circuit assembly of claim 1, wherein the sulfur-based constituent comprises a disulfide or a tetrasulfide.

3. The integrated circuit assembly of claim 1, wherein the polymer material comprises a carrier material and a filler material and wherein the self-healing constituent is attached to at least one of the carrier material and the filler material.

4. The integrated circuit assembly of claim 2, wherein the filler material comprises at least one a carbon-type filler, a metal material, and a ceramic material.

5. The integrated circuit assembly of claim 4, wherein the carbon-type filler comprises graphene or carbon black.

6. The integrated circuit assembly of claim 1, wherein the self-healing constituent is encased in shells dispersed in the polymer material.

7. The integrated circuit assembly of claim 6, further comprising a catalytic agent dispersed in the polymer material.

8. The integrated circuit assembly of claim 7, wherein the catalytic agent is encased in shells.

9. The integrated circuit assembly of claim 1, further comprising a substrate, wherein the at least one integrated circuit device is electrically attached to the substrate.

10. An integrated circuit assembly, comprising:
    at least one integrated circuit device;
    a heat dissipation device thermally contacting the at least one integrated circuit device; and
    a thermal interface material between the at least one integrated circuit device and the heat dissipation device, wherein the thermal interface material comprises a polymer material and a self-healing constituent, the polymer material comprises a carrier material and filler material, the self-healing constituent is attached to at least one of the carrier material and the filler material, and the filler material comprises at least one of graphite, graphene, carbon nanotubes, and carbon black.

11. The integrated circuit assembly of claim 10, wherein the self-healing constituent comprises a sulfur-based constituent.

12. The integrated circuit assembly of claim 10, wherein the filler material comprises graphene.

13. The integrated circuit assembly of claim 10, wherein the filler material comprises carbon black.

14. The integrated circuit assembly of claim 10, wherein the self-healing constituent is encased in shells dispersed in the polymer material.

15. The integrated circuit assembly of claim 14, further comprising a catalytic agent dispersed in the polymer material.

16. The integrated circuit assembly of claim 15, wherein the catalytic agent is encased in shells.

17. The integrated circuit assembly of claim 10, further comprising a substrate, wherein the at least one integrated circuit device is electrically attached to the substrate.

18. An integrated circuit assembly, comprising:
    at least one integrated circuit device;
    a heat dissipation device thermally contacting the at least one integrated circuit device; and
    a thermal interface material between the at least one integrated circuit device and the heat dissipation device, wherein the thermal interface material comprises a polymer material and a self-healing constituent, and wherein the self-healing constituent is encased in shells dispersed in the polymer material.

19. The integrated circuit assembly of claim 18, wherein the self-healing constituent comprises a sulfur-based constituent.

20. The integrated circuit assembly of claim 18, wherein the polymer material comprises a carrier material and a filler material and wherein the self-healing constituent is attached to at least one of the carrier material and the filler material.

21. The integrated circuit assembly of claim 20, wherein the filler material comprises at least one of a carbon-type filler, a metal material, and a ceramic material.

22. The integrated circuit assembly of claim 21, wherein the carbon-type filler comprises graphene or carbon black.

23. The integrated circuit assembly of claim 18, further comprising a catalytic agent dispersed in the polymer material.

24. The integrated circuit assembly of claim 23, wherein the catalytic agent is encased in shells.

25. The integrated circuit assembly of claim 18, further comprising a substrate, wherein the at least one integrated circuit device is electrically attached to the substrate.

* * * * *